United States Patent
Ma et al.

(10) Patent No.: US 12,394,183 B2
(45) Date of Patent: Aug. 19, 2025

(54) GENERATING TRAINING SAMPLES VIA 3D MODELING FOR GREENHOUSE GAS EMISSION DETECTION

(71) Applicant: Saudi Arabian Oil Company, Dhahran (SA)

(72) Inventors: Yong Ma, Katy, TX (US); Ali Almadan, Houston, TX (US); Weichang Li, Katy, TX (US); Damian Pablo San Roman Alerigi, Al Khobar (SA)

(73) Assignee: Saudi Arabian Oil Company, Dhahran (SA)

( * ) Notice: Subject to any disclaimer, the term of this patent is extended or adjusted under 35 U.S.C. 154(b) by 425 days.

(21) Appl. No.: 17/994,993

(22) Filed: Nov. 28, 2022

(65) Prior Publication Data

US 2024/0177457 A1 May 30, 2024

(51) Int. Cl.
*G06K 9/62* (2022.01)
*G06F 30/27* (2020.01)
*G06V 10/774* (2022.01)

(52) U.S. Cl.
CPC ............ *G06V 10/774* (2022.01); *G06F 30/27* (2020.01)

(58) Field of Classification Search
None
See application file for complete search history.

(56) References Cited

U.S. PATENT DOCUMENTS

| | | | | |
|---|---|---|---|---|
| 10,953,334 | B2* | 3/2021 | Kolen | A63F 13/63 |
| 11,727,657 | B2* | 8/2023 | Melling | G06N 20/00 |
| | | | | 345/424 |
| 11,774,426 | B1* | 10/2023 | Eichenlaub | G01D 21/02 |
| | | | | 73/31.02 |
| 11,927,581 | B2* | 3/2024 | Gadot | G01N 33/0075 |
| 11,948,355 | B2* | 4/2024 | Boulanger | G06N 3/08 |

(Continued)

FOREIGN PATENT DOCUMENTS

| | | | | |
|---|---|---|---|---|
| CN | 110133443 | A * | 8/2019 | .......... G01R 31/085 |
| CN | 114372940 | A * | 4/2022 | |

(Continued)

OTHER PUBLICATIONS

Zaki et al., "Drone based Virtual Reality System for Inspection of Oil and Gas Platform," 2022 IEEE 5th International Symposium in Robotics and Manufacturing Automation (ROMA), Malacca, Malaysia, 2022, pp. 1-5 (Year: 2022).*

(Continued)

*Primary Examiner* — Feng Niu
(74) *Attorney, Agent, or Firm* — Fish & Richardson P.C.

(57) ABSTRACT

A computer-implemented method for generating training samples via 3D modeling for machine learning-based greenhouse gas emission detection is described. The method includes generating at least one 3D model corresponding to a real-world facility and at least one 3D model corresponding to gas plume emissions and building a virtual environment comprising a 3D field based on the at least one 3D model corresponding to the real-world facility and the at least one 3D model corresponding to gas plume emissions. The method also includes capturing images or video of the 3D field via simulation of the virtual environment and assigning labels to objects in the images or videos.

18 Claims, 11 Drawing Sheets

(56) References Cited

U.S. PATENT DOCUMENTS

| | | | |
|---|---|---|---|
| 12,100,230 B2* | 9/2024 | Wang | G06V 10/26 |
| 12,190,448 B2* | 1/2025 | Wang | G06V 20/56 |
| 2014/0063009 A1 | 3/2014 | Buehler et al. | |
| 2017/0061625 A1* | 3/2017 | Estrada | G06N 3/04 |
| 2020/0302241 A1* | 9/2020 | White | G06V 10/772 |
| 2020/0306640 A1* | 10/2020 | Kolen | A63F 13/67 |
| 2021/0150267 A1* | 5/2021 | Boulanger | H04N 23/11 |
| 2021/0374547 A1 | 12/2021 | Wang et al. | |
| 2022/0065834 A1* | 3/2022 | Gadot | G01N 33/0062 |
| 2022/0091026 A1 | 3/2022 | Scott et al. | |
| 2022/0292543 A1* | 9/2022 | Henderson | G06Q 30/0252 |
| 2022/0327789 A1* | 10/2022 | Melling | G06F 3/04845 |
| 2023/0135234 A1* | 5/2023 | Wang | G06V 10/774 |
| | | | 382/103 |
| 2023/0139772 A1* | 5/2023 | Wang | G06N 3/08 |
| | | | 345/419 |
| 2023/0162488 A1* | 5/2023 | Boulanger | G06V 10/82 |
| | | | 382/157 |
| 2023/0176023 A1* | 6/2023 | Wang | G01N 33/0034 |
| | | | 340/632 |
| 2023/0252764 A1* | 8/2023 | Gilpin | G06T 11/001 |
| | | | 382/157 |
| 2023/0304982 A1* | 9/2023 | Eichenlaub | G01N 33/0062 |
| 2024/0029232 A1* | 1/2024 | Korjani | G06V 20/52 |
| 2024/0037925 A1* | 2/2024 | Lim | B33Y 40/20 |
| 2024/0040995 A1* | 2/2024 | Li | A01K 11/004 |
| 2024/0296662 A1* | 9/2024 | Solowjow | G06T 15/20 |

FOREIGN PATENT DOCUMENTS

| | | | |
|---|---|---|---|
| JP | 7133700 B1 | * | 9/2022 |
| WO | WO-2023229705 A1 | * | 11/2023 |

OTHER PUBLICATIONS

Chen et al., "Constructing virtual parallel system for offshore oil subsea production," Proceedings of 2012 IEEE International Conference on Service Operations and Logistics, and Informatics, Suzhou, China, 2012, pp. 389-393, doi: 10.1109/SOLI.2012.6273568. (Year: 2012).*
CN-110133443-A (machine translation) (Year: 2019).*
CN-114372940-A (machine translation) (Year: 2022).*
JP-7133700-B1 (machine translation) (Year: 2022).*
WO-2023229705-A1 (machine translation) (Year: 2023).*
Idoughi et al., "Background Radiance Estimation for Gas Plume Quantification for Airborne Hyperspectral Thermal Imaging," Journal of Spectroscopy, Jan. 2016, 5428762, 17 pages.
Irakulis-Loitxate et al., "Satellite-based survey of extreme methane emissions in the Permian basin," Science Advance, Jun. 2021, 7(27):eabf4507, 9 pages.
Johnson-Roberson et al., "Driving in the matrix: Can virtual worlds replace human-generated annotations for real world tasks?," arXiv Cornell University, Oct. 2016, 8 pages.
Jongaramrungruang et al., "MethaNet—an AI-driven approach to quantifying methane point-source emission from high-resolution 2D plume imagery," Remote Sensing of Environment, Feb. 2022, 269:112809, 6 pages.
Kumar et al., "Deep Remote Sensing Methods for Methane Detection in Overhead Hyperspectral Imagery," IEEE Winter Conference on Applications of Computer Vision (WACV), 2020, 1765-1774, 10 pages.
LeCun et al., "Deep learning," Nature, May 2015, 521:436-444, 9 pages.
Park et al., "ChangeSim: Towards End-to-End Online Scene Change Detection in Industrial Indoor Environments," 2021 IEEE/RSJ International Conference on Intelligent Robots and Systems (IROS), Sep. 2021, pp. 8578-8585, 8 pages.
Rao et al., "Improving Imaging Spectrometer Methane Plume Detection with Large Eddy Simulations," AGU Fall Meeting Abstracts, Dec. 2021, GC45B-0838, 3 pages.
Shah et al., "AirSim: High-Fidelity Visual and Physical Simulation for Autonomous Vehicles," Field and Service Robots, Nov. 2017, 621-635, 15 pages.
Thorpe et al., "Airborne DOAS retrievals of methane, carbon dioxide, and water vapor concentrations at high spatial resolution: Application to Aviris-Ng," Atmospheric Measurement Techniques, Oct. 2017, 10(10), 3833-3850, 18 pages.
Wang et al., "VideoGasNet: Deep learning for natural gas methane leak classification using an infrared camera," Energy, Jan. 2022, 238(B):121516, 11 pages.
Zhao et al., "Object detection with deep learning: A review," IEEE transactions on neural networks and learning systems, Jan. 2019, 30(11):3212-3232, 21 pages.
SAIP Examination Report in SAIP Appln. No. 123450878, mailed on Mar. 20, 2025, 14 pages, with English Translation.

* cited by examiner

GENERATING TRAINING SAMPLES VIA 3D MODELING FOR GREENHOUSE GAS EMISSION DETECTION

TECHNICAL FIELD

This disclosure relates generally to machine-learning based gas emission detection.

BACKGROUND

Oil and gas fields include areas of accumulation of respective hydrocarbons in reservoirs, trapped as it rises by impermeable rock formations. Drilling produces hydrocarbons. Greenhouse gases (GHG) can be emitted when producing hydrocarbons. GHG absorb light, including infrared radiation. Each gas has a distinctive absorption fingerprint. The absorption fingerprint can be used to identify and measure that gas.

SUMMARY

An embodiment described herein provides a method for generating training data using three dimensional (3D) modeling for machine learning-based greenhouse gas emission detection in oil and gas fields. The method includes generating, using at least one hardware processor, at least one 3D model corresponding to a real-world facility and at least one 3D model corresponding to gas plume emissions. The method also includes building, using at least one hardware processor, a virtual environment comprising a 3D field based on the at least one 3D model corresponding to the real-world facility and the at least one 3D model corresponding to gas plume emissions. Additionally, the method includes capturing, using the at least one hardware processor, images or video of the 3D field via simulation of the virtual environment. The method includes assigning, using the at least one hardware processor, labels to objects in the images or videos, and training, using the at least one hardware processor, machine learning models using training samples including the labeled images or videos.

An embodiment described herein provides an apparatus comprising a non-transitory, computer readable, storage medium that stores instructions that, when executed by at least one processor, cause the at least one processor to perform operations. The operations include generating at least one 3D model corresponding to a real-world facility and at least one 3D model corresponding to gas plume emissions and building a virtual environment comprising a 3D field based on the at least one 3D model corresponding to the real-world facility and the at least one 3D model corresponding to gas plume emissions. The operations also include capturing images or video of the 3D field via simulation of the virtual environment and assigning labels to objects in the images or videos. Additionally, the operations include training machine learning models using training samples including the labeled images or videos.

An embodiment described herein provides a system. The system comprises one or more memory modules and one or more hardware processors communicably coupled to the one or more memory modules. The one or more hardware processors is configured to execute instructions stored on the one or more memory models to perform operations. The operations include generating at least one 3D model corresponding to a real-world facility and at least one 3D model corresponding to gas plume emissions and building a virtual environment comprising a 3D field based on the at least one 3D model corresponding to the real-world facility and the at least one 3D model corresponding to gas plume emissions. The operations also include capturing images or video of the 3D field via simulation of the virtual environment and assigning labels to objects in the images or videos. Additionally, the operations include training machine learning models using training samples including the labeled images or videos.

DETAILED DESCRIPTION

Figure 1:
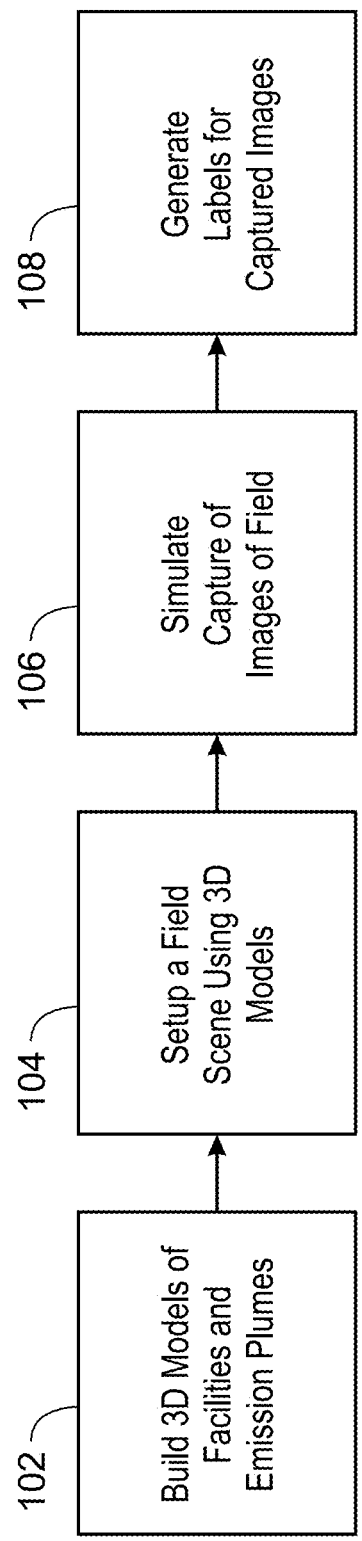
FIG. 1 is a workflow for generating training samples for machine learning-based emission detection.

Machine learning models are trained to make predictions (e.g., outputs). For example, machine learning models are trained using a dataset. The machine learning model makes decisions and learns from the dataset. Once trained, the machine learning model can make decisions in response to unseen data, and make predictions about the unseen data. Machine learning models, such as deep learning models, consume a large amount of training data. Training data is often scarce. For example, deep learning models are trained to predict GHG emissions using training samples including images or video of oil and gas fields and the labels indicating the types of facility and emissions present in the images or video. Obtaining training samples including real world images and the corresponding labels can be challenging. Costs are high for acquiring abundant amount of labeled images and video from oil and gas fields, especially from oil and gas fields at remote locations. In addition, generating accurate labels of real world images can be labor intensive and time consuming.

Embodiments described herein enable a three dimensional (3D) modeling framework which, when combined with machine learning techniques, overcomes the challenges of limited labeled data (e.g., training samples) and generates sufficient training samples for machine learning based emission detection. In some embodiments, the training samples includes synthetic data. The generation of synthetic data is cost-effective and time-efficient and enables trained models that make accurate predictions on real-world input data. In examples, the synthetic data includes multichannel images that with varying spectral bands such as those detected by hyperspectral imaging. The present techniques enable computer vision-based machine learning and deep learning models trained using the synthetic data, such as object detection models and image segmentation models, to detect whether GHG emissions present at the oil and gas fields from the synthetic, hyperspectral images. The present techniques enable the generation of a large amount of training samples.

Training a model with training samples that include labeled data generated automatically from a simulation engine improves the model performance when executed on real-world input data. A machine learning model trained as described by the present techniques achieves high performance on real-world data by detecting scene changes in input images or videos. For example, a machine learning model trained according to the present techniques classifies objects according to different labels, such as change types (e.g., missing, new, replaced, and rotated objects) at different lighting and weather conditions. In examples, real-world data refers to capture images or video or a real-world oil and gas field. For example, cameras equipped with spectrometers are employed to capture images around real-world oil and gas field facilities, where potential GHG emissions from different sources can be imaged in corresponding spectral bands.

Meeting goals associated with sustainable oil field operations includes understanding the levels, the locations, and the breakdown patterns of the emission of greenhouse gases (GHG) throughout the operation units and field types. A goal for oil and gas field operation is achieving net-zero, which is a balance between the amount of greenhouse gases placed into the atmosphere by operators and the amount taken out of the atmosphere by operators. In examples, distribution maps (e.g., maps of oil and gas fields) of emission sources such as Methane ($CH_4$), suggest that 59% of emissions are from recent production facilities vs. 41% from production facilities operable prior to 2018; 50% of emissions are from compression stations, 24% of emissions are from tank batteries, 21% of emissions are from flaring, and 6% of emissions from wellheads. An accurate knowledge about distributions of GHG emissions enable effective carbon capture and storage (CCS) and is used to optimize production to reduce potential emissions. In some embodiments, the training samples generated according to the present are used to train machine learning models that can predict the levels, the locations, and the breakdown patterns of the emission of greenhouse gases (GHG) throughout the operation units and field types. The trained machine learning models are used to implement effective CCS and optimize production at real-world facilities to reduce potential GHG emissions.

FIG. 1 is a workflow 100 for generating training samples for machine learning-based emission detection. In examples, the workflow 100 generates images or video of virtual oil and gas fields with GHG emissions. In examples, a virtual oil and gas field corresponds to a real-world oil and gas field including equipment and facilities, such as a well pad. Additionally, in examples, the GHG emissions correspond to hyperspectral bands of the generated images or video of the virtual oil and gas fields.

At block 102, 3D models of facilities and GHG emission plumes are built. The 3D models are further described with respect to FIG. 2. In examples, 3D models of production facilities include various structures and devices used in hydrocarbon production. In examples, 3D models of GHG gas emission plumes include fingerprints associated with respective greenhouse gases. At block 104, virtual field scenes are constructed using the 3D models (e.g., the models built as described at block 102). In examples, scenes are environments where models locate. Virtual field scenes include virtual oil and gas fields and GHG emissions that replicate real-world oil and gas fields with varying GHG emissions. At block 106, images and/or video of the virtual fields modeled in the virtual field scenes is captured. For examples, images or video are captured while the simulated virtual oil and gas field produce varying GHG emissions under varying environmental conditions. In examples, the images or video of the virtual field scenes are captured from different angles, with different image intensity distributed over several channels mimicking different spectral bands in hyperspectral imaging during the simulation. In examples, the spectral bands replicate real world spectral bands produced by gases. At block 108, labels are generated for the virtual field scenes generated by simulation of GHG emissions from the modeled of facilities according to the modeled gas emissions. In the examples, the labels are masks and/or bounding boxes corresponding to the multichannel (e.g., containing different spectral bands in hyperspectral imaging) images and/or videos. In examples, the labels and corresponding images or videos are used to create training sample data sets for subsequent tasks, such as training machine learning models to detect GHG emission in oil and gas fields.

Figure 2:
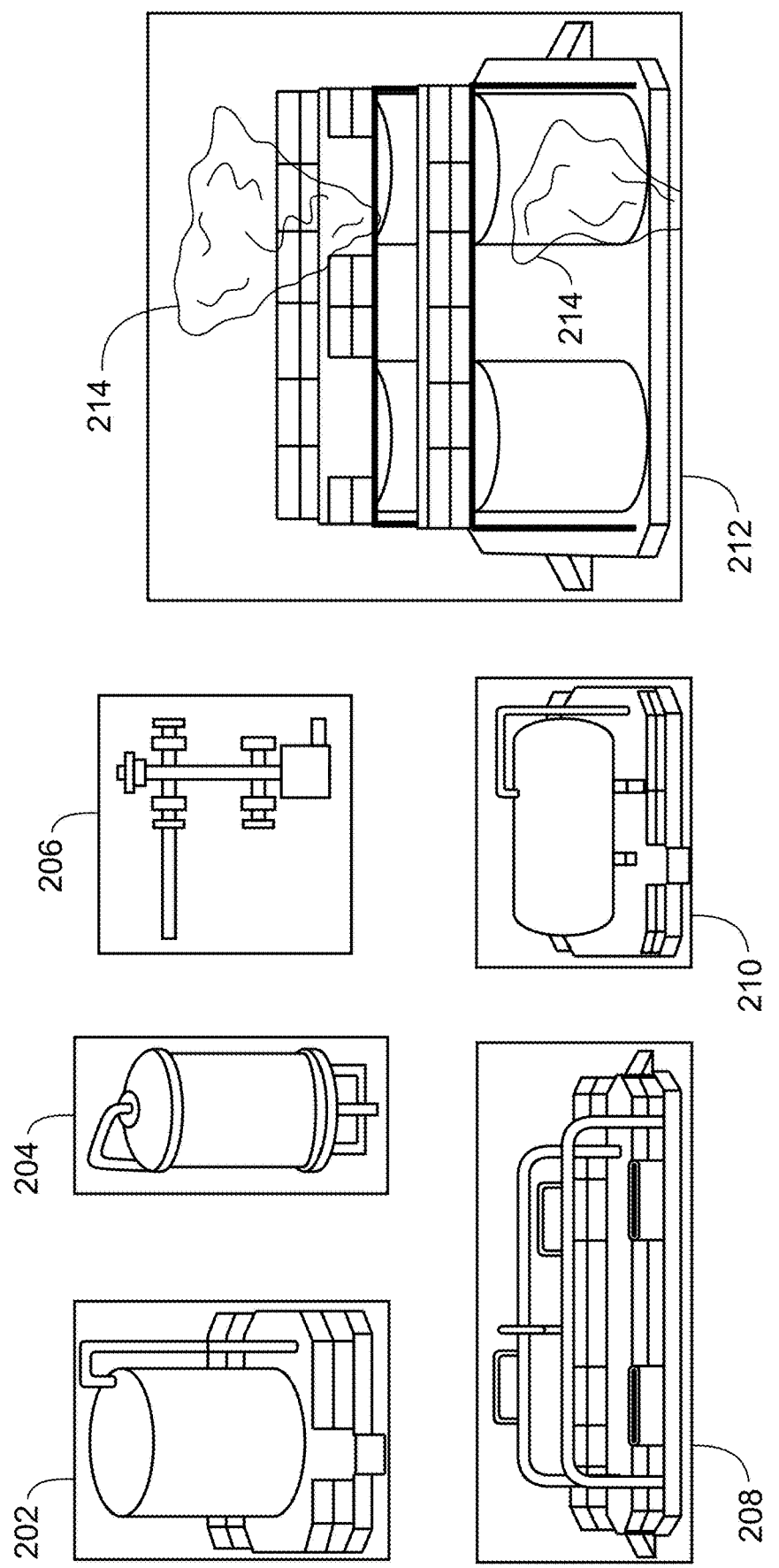
FIG. 2 shows three dimensional (3D) models.

FIG. 2 shows 3D models 200. In the example of FIG. 2, 3D models 200 include a tank 3D model 202, a separator—I 3D model 204, a wellhead 3D model 206, a gas plant 3D model 208, a separator—II 3D model 210, and a tank battery 3D model 212. Gas plume 3D models 214 are shown near the tank battery 3D model 212. In examples, facilities of an oil and gas field include an oil and gas well head, oil storage tank, water tank, separator, natural gas plant, etc. 3D models 200 are built for these common facilities, including the 3D models 200 shown in FIG. 2. In some embodiments, 3D modeling software packages are used to build the 3D models 200. The 3D modeling software packages include, for example, computer-aided design applications that enable the creation, modification, analysis, or optimization of modeled facilities. In examples, the 3D modeling software packages include, but are not limited to, Autodesk, 3ds Max, Blender, Unreal Engine, and Unity. Gas emission plumes are synthesized using 3D modeling. In the example of FIG. 2, the tank battery 3D model 212 is associated with gas plume 3D models 214. In examples, the 3D models include objects associated with each respective model. For example, the tank 3D model 202 is associated with a tank object, the separator—I 3D model 204 is associated with a separator—I object, the wellhead 3D model 206 is associated with a wellhead object, the gas plant 3D model 208 is associated with a gas plant object, the separator—II 3D model 210 is associated with a separator—II object, the tank battery 3D model 212 is associated with a tank battery object, and the gas plume 3D models 214 are associated with gas plume objects. In examples, the shape, aspect ratio, color and texture of the 3D models 200 is modified to reflect more variations, such as those that occur in the real world.

Figure 3:
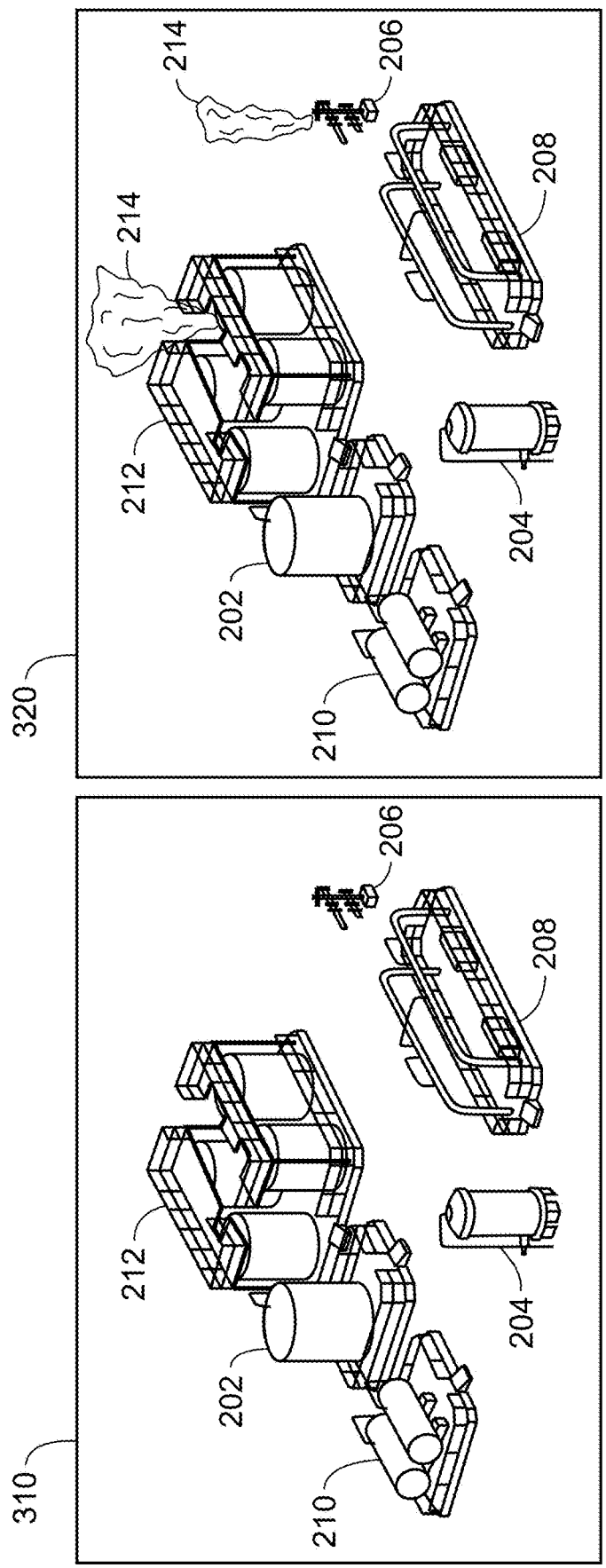
FIG. 3 shows virtual oil and gas well pads.

FIG. 3 shows virtual oil and gas well pads 300. In examples, the well pads 300 represent areas under the control of an oil or natural gas company, occupied by equipment or facilities necessary or required for the drilling, production or plugging of an oil or natural gas well. The well pad 310 is shown without emission plumes. The well pad 310 includes emission plumes 340 and 342. As shown in FIG. 3, the well pad 310 includes a tank 3D model 202, a separator—I 3D model 204, a wellhead 3D model 206, a gas plant 3D model 208, a separator—II 3D model 210, and a tank battery 3D model 212 without gas plume emissions. The well pad 320 includes a tank 3D model 202, a separator—I 3D model 204, a wellhead 3D model 206, a gas plant 3D model 208, a separator—II 3D model 210, a tank battery 3D model 212, and a gas plume 3D model 214. In some embodiments using the layout of a real-world oil and gas field as a reference, a virtual field scene is built, such as the well pad 310 and the well pad 320. In examples, the virtual field scene is a 3D field environment is built using software packages. In examples, the virtual field scene is built using a 3D computer graphics engine. For example, the 3D computer graphics engine is a software framework designed for the development of simulations, and generally includes relevant libraries and support programs. The graphics engine may include a rendering engine ("renderer") for 2D or 3D graphics, a physics engine or collision detection (and collision response), sound, scripting, animation, artificial intelligence, networking, streaming, memory management, threading, localization support, scene graph, and video support for cinematics. In examples, the software packages used to build the 3D field environment is, for example, the Unreal Engine, 3D computer graphics game engine developed by Epic Games or Unity, a cross-platform game engine developed by Unity Technologies. In some embodiments, the 3D models (e.g., 3D models 200) are loaded and their relative locations arranged to replicate a real-world facility or a proposed real-world facility. Well pad 310 illustrates a virtual oil and gas well pad including different types of production facilities such as tanks and a wellhead. In examples, 3D gas plumes are added around the oil storage tanks, wellhead, compressor stages, or flow lines to simulate GHG emission leakages. As shown in the example of well pad 320, gas plume 3D models 214 are added as associated with emissions from the tank battery 3D model 212 and wellhead 3D model 206. For ease of illustration, the gas plume 3D models 214 are added as associated with emissions from the tank battery 3D model 212 and wellhead 3D model 206. However, the gas plume 3D models 214 are associated with any of the oil field facilities 3D models. In examples, the virtual field scene is built with gas plume 3D models 214 associated with any of the tank 3D model 202, separator—I 3D model 204, wellhead 3D model 206, gas plant 3D model 208, separator—II 3D model 210, or tank battery 3D model 212.

Figure 4:
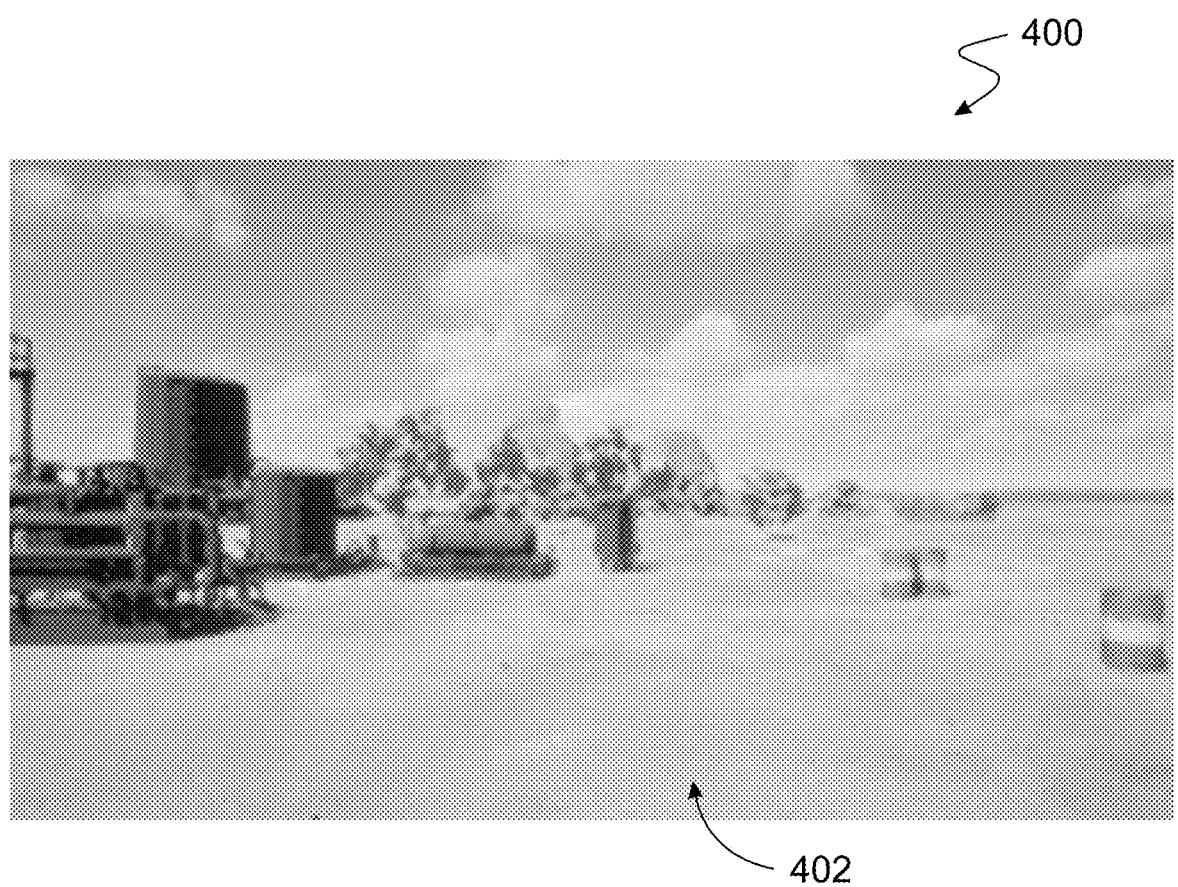
FIG. 4 is an illustration of a virtual field scene in a 3D virtual environment.

FIG. 4 is an illustration of a virtual field scene 402 in a 3D virtual environment 400. In the 3D virtual environment 400, the background can be adjusted to simulate a variety of realistic scenarios. In the example of FIG. 4, the environment 400 simulates a desert environment. In some embodiments, the environmental conditions that occur in virtual field scenes vary. Environmental conditions include, but are not limited to, illumination (e.g., daylight, night light, artificial), temperature, precipitation, wind, and biome (e.g., tropical rainforest, temperate forest, desert, tundra, taiga (Boreal Forest), grassland, savanna).

Figure 5:
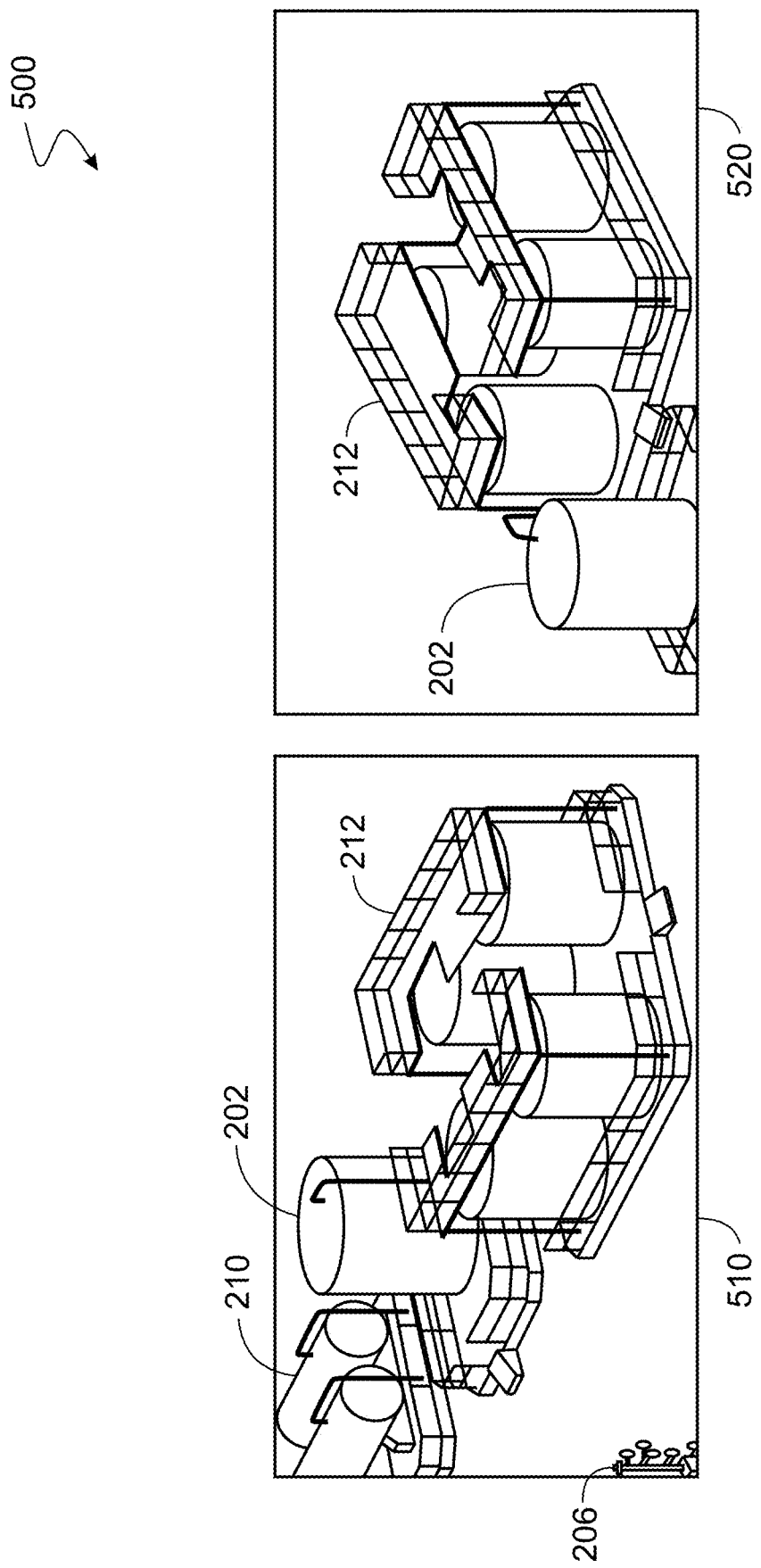
FIG. 5 is an illustration of a virtual field scene including a virtual 3D oil and gas field for simulation at varying angles.

FIG. 5 is an illustration of a virtual field scene 500 including a virtual 3D oil and gas field for simulation at varying angles. In the example of FIG. 5, a same virtual 3D oil and gas field including the same field facilities is shown in an image 510 and an image 520. The image 510 shows backlighting, and the image 520 shows front lighting. The present techniques vary illumination in the virtual field scene based on the illumination sources, demonstrating illumination of the 3D objects by one or more illumination sources. In the example of FIG. 5, the virtual oil and gas field is a real-world facility that corresponds to a physical oil and gas field. As shown in FIG. 5, geometrically dispersed light sources can provide illumination to the 3D models, which include a tank 3D model 202, wellhead 3D model 206, a separator—II 3D model 210, and a tank battery 3D model 212. Illumination sources include natural and artificial light sources with specific spectra and radiance. In examples, the spectra and radiance is constant or dynamic. Natural illumination sources include sunlight, moonlight, starlight, and the like. Natural illumination sources also include lighting that occurs during simulated environmental conditions, such as lightening that occurs during thunderstorms. Artificial illumination sources include light bulbs, electric lights, tube lights, lamps, torches, fire, flaring, lighters, candles, fireworks, lasers, and the like. In a simulation of the virtual 3D oil and gas field, light scatters and/or is absorbs by the 3D models. Light is transmitted from the illumination sources such that real world illumination sources are replicated. In a simulation, illumination is simulated by a portion of the illumination reaching the sensors of a virtual hyperspectral camera. In examples, the illumination is simulated at spectral fingerprints of GHG present in the scene.

Figure 6:
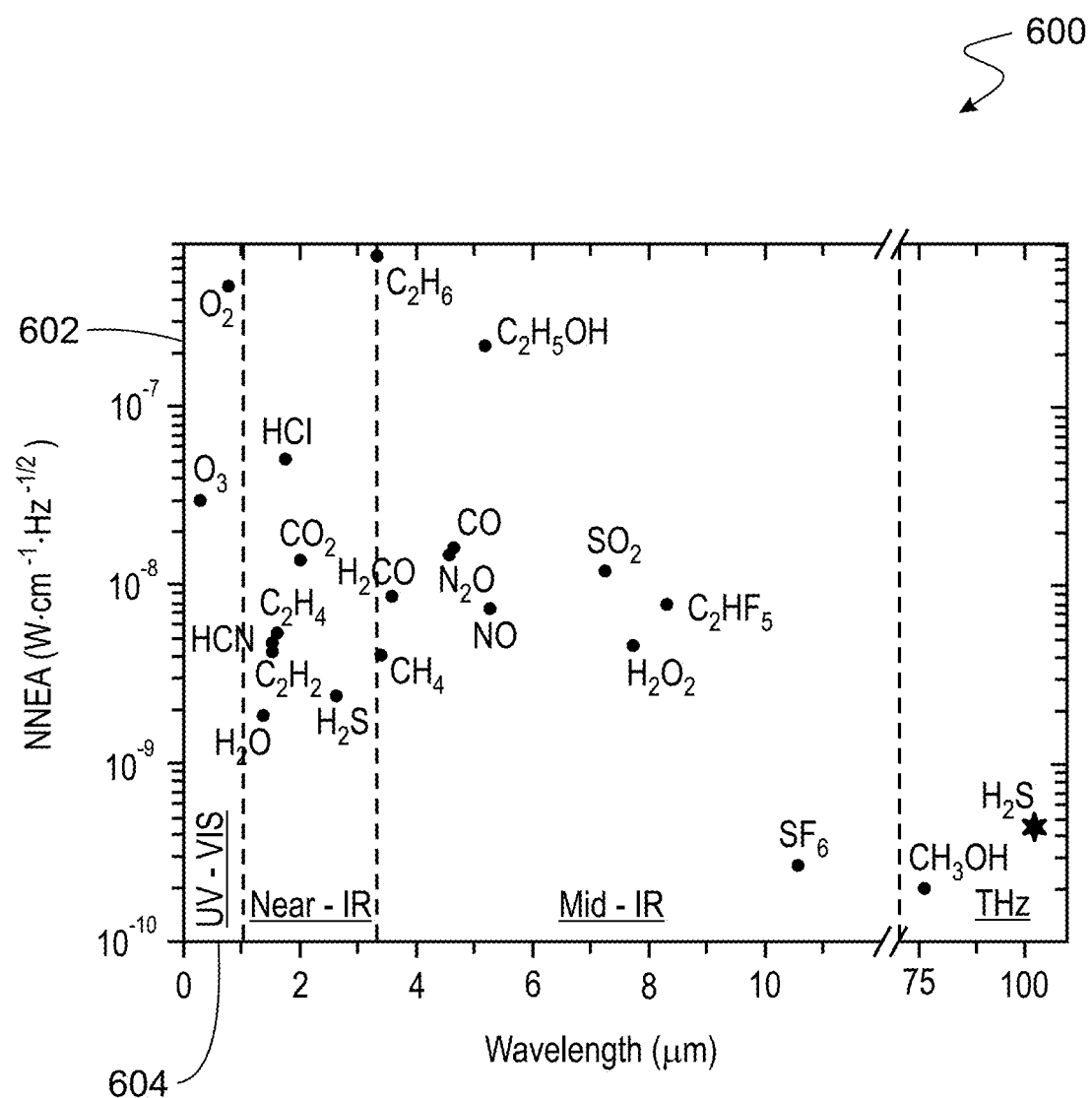
FIG. 6 is a plot showing spectral fingerprints representing typical GHGs.

FIG. 6 is a plot 600 showing spectral fingerprints representing GHGs. In particular, the plot 600 includes fingerprints that are the result of normalized noise equivalent absorption coefficient (NNEA) 602 and wavelength 604. The GHGs include but are not limited to $O_3$, $O_2$, $H_2O$, HCN, HCl, $C_2H_2$, $C_2H_4$, $CO_2$, $H_2S$, $H_2CO$, $C_2H_6$, $CH_4$, $N_2O$, NO, CO, $C_2H_5OH$, $SO_2$, $H_2O_2$, $C_2HF_5$, $SF_6$, $CH_3OH$, $H_2S$, and THz. The wavelength 604 portion of the fingerprint spans visible ultra-violet, near infrared, mid-infrared, up to terahertz of frequencies. The spectral images can be generated either by solving a raytracing model using the spectral transmittance and reflectance curves of each material in the scene, or by controlling the Hue Saturation Value (HSV) scale (e.g., transmittance and reflectance) of all materials in the scene to match the expected response of the materials. In some embodiments, the hyperspectral maps are 3D tensors (x-position, y-position, wavelength), where the elements are the measured intensity values. In examples, the proper hyperspectral bands are selected to synthesize desired hyperspectral imageries by distributing the image intensity selectively over several different channels corresponding to different spectral fingerprints representing typical GHGs, hazardous air pollutants (HAPs), and mixtures.

In some embodiments, the images also include the spectral imagery of the background (facilities, flora, etc.). Object properties, including object materials, color, reflectivity, attenuation, and light source emissivity, are adjusted to reflect more accurate modeling of real-world scenarios. Physical forces can also be added to simulate the effects of wind, temperature gradient, and humidity. These forces can be defined as acting on the particle flows making the leaked gas surrogates.

Figure 7:
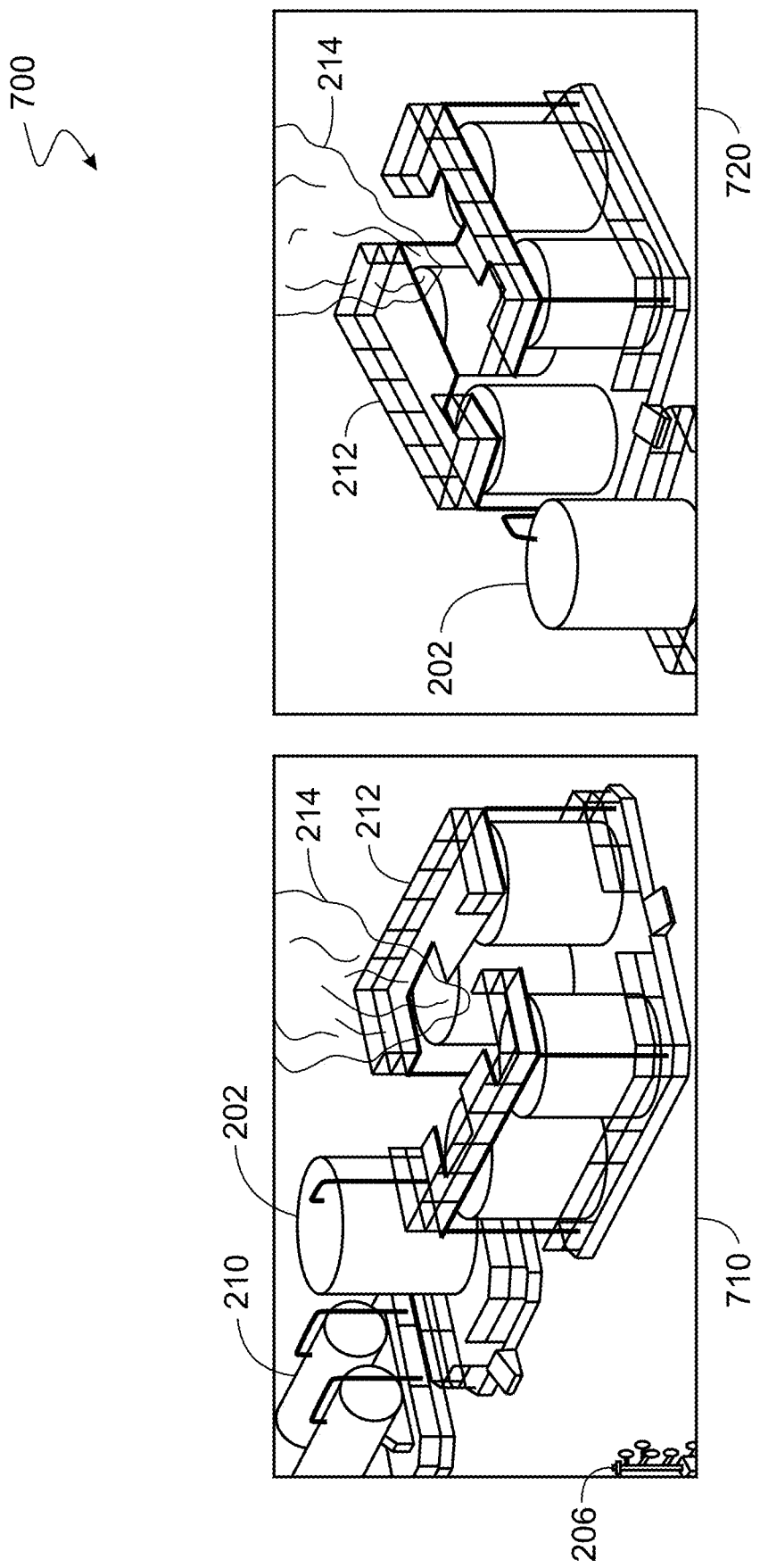
FIG. 7 is an illustration of a virtual field scene including a virtual 3D oil and gas field for simulation at varying angles.

FIG. 7 is an illustration of a virtual field scene 700 including a virtual 3D oil and gas field for simulation at varying angles. In the example of FIG. 7, a same virtual 3D oil and gas field including the same field facilities is shown in an image 710 and an image 720. The image 710 shows backlighting, and the image 720 shows front lighting, demonstrating illumination of the light source to the 3D objects represented by 3D models. As shown in FIG. 7, geometrically dispersed light sources provide illumination to the 3D models, which include a tank 3D model 202, wellhead 3D model 206, a separator—II 3D model 210, and a tank battery 3D model 212. In examples, the 3D models of the images simulate gas plume emissions, including emissions from 3D models not included in the respective image. For example, although not illustrated in image 720, the wellhead 3D model 206 and separator—II 3D model 210 are associated with gas plume emissions represented in the image 720, as the wellhead 3D model 206 and separator—II 3D model 210 are off screen as components of the same virtual 3D oil and gas field. Accordingly, in each image the virtual 3D oil and gas field is simulated as producing GHG emissions by gas plume 3D models, if present in the particular image. In embodiments, gas plume emissions correspond to average emission values from respective oil and gas facilities.

Images and/or videos of the virtual field are captured by simulating emissions over time in the presences of varying illumination sources and environmental conditions. Like taking images and videos using cameras in the real world, virtual cameras are inserted at locations in the virtual 3D environments including the virtual 3D oil and gas fields. A geometry relationship is defined relative to the objects represented by 3D models. In examples, the data is acquired by generating images via a computer graphics process, i.e., 3D rendering, which converts the 3D models and scenes into a 2D image (or a 3D volume containing a series of 2D images for the hyperspectral case) that capture how the objects appear in the cameras deployed virtually in the environment. In addition to static images, virtual cameras can also record the field scene in videos, which can be treated as a series of image frames. In some embodiments, the 3D field scene is converted to a 3D point cloud, which can then be used to synthesize measurements from LiDAR. In examples, LiDAR can be used to detect GHG gas plumes. The synthesized LiDAR measurements serve as training data for building machine learning models to detection gas plumes using LiDAR.

In some embodiments, the cameras are deployed in the virtual 3D oil and gas field to enable simulated drone-based data acquisition. For example, the simulation is performed by drone, ground vehicle, and various other objects simulators, that replicate drone, vehicle, or object movement. In examples, the drone simulator is an open-source, cross platform simulator for drones, ground vehicles such as cars and various other objects. The simulator executes simulations based on deep learning, computer vision and reinforcement learning algorithms for autonomous vehicles, which enables replication and testing of autonomous solutions. In examples, the simulator is Aerial Informatics and Robotics Simulation (AirSim). As shown in FIGS. 5 and 7, the cameras deployed in the virtual 3D oil and gas field mimic drone-based data acquisition in the real world. In examples, the synthetic drone-based data acquisition is used for data survey in oil and gas fields that are at remote locations. In examples, FIG. 7 shows images of a field in the bird-eye view from virtual cameras installed on a drone. In examples, the drone is routed following a pre-defined path across time. By repeating this process on the same route, potential time-lapse changes of GHG emissions in the field can be recorded, as illustrated by the differences between FIG. 5 and FIG. 7.

To simulate hyperspectral images, spectral bands are set that the images will model. For each hyperspectral band, one spectral frame, i.e., a 2D rendering of the 3D scene in the specific hyperspectral band, is generated by the virtual camera. Stacking all spectral frames together will then produce a hyperspectral image, which is a 3D volume.

Figure 8:
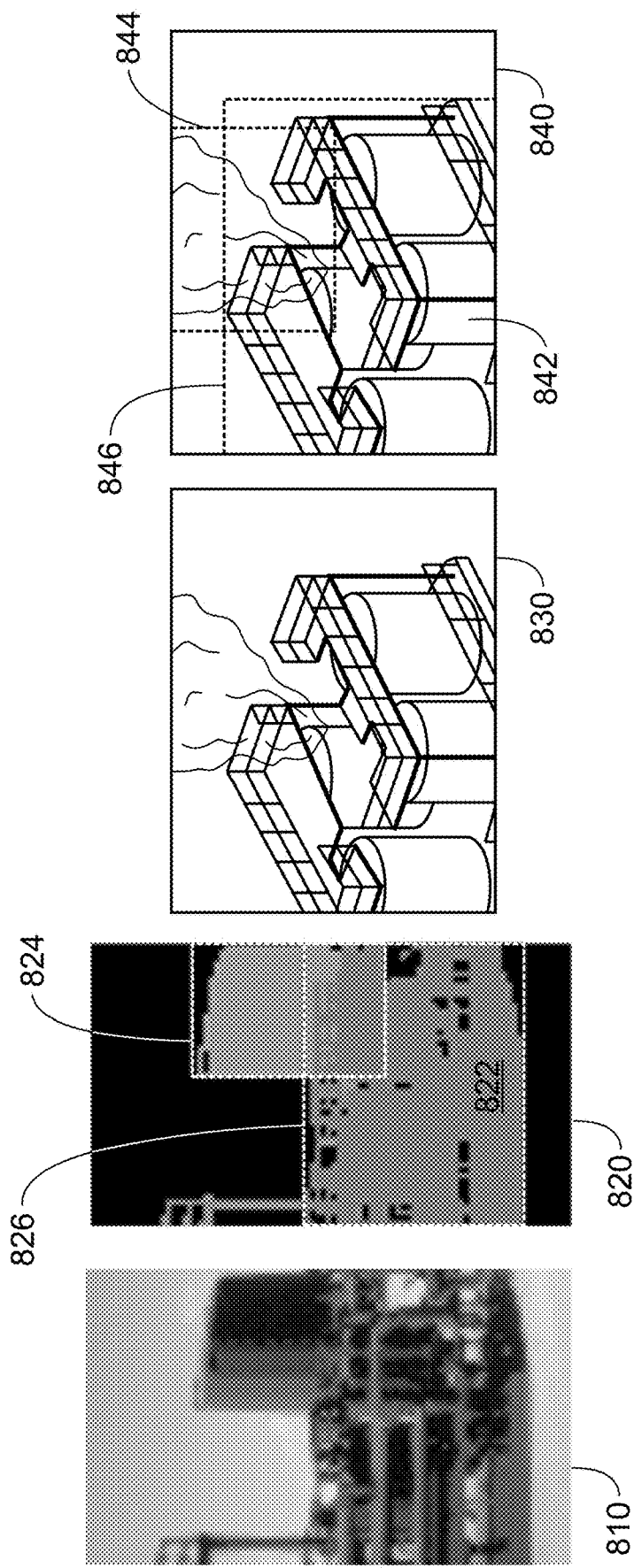
FIG. 8 shows an example of generating labels for an image.

FIG. 8 shows an example of generating labels for an image. FIG. 8 shows images of the field scene (810, 830) and corresponding labels (820, 840). In examples, the labels are masks and bounding boxes associated with areas captured by images or video. The labels contain both segmentation masks 822 and 842 (shown by hatching) for semantic and instance segmentations and bounding boxes 824, 826, 844 and 846 for object detection.

In examples, labels are created for the synthetic images and/or videos created via simulation. In the 3D virtual environment, a unique ID and color are assigned to each object type. Table 1 shows an example of IDs that correspond to each facility type.

| ID | 1 | 2 | 3 | 4 | 5 | 6 |
|---|---|---|---|---|---|---|
| Type | Tank | Tank battery | Separator - I | Separator - II | Gas plant | Wellhead |

When the virtual cameras capture the images and/or videos, segmentation masks for each object are generated simultaneously by filling the object with the assigned color. The segmentation masks can be repurposed into bounding boxes. For example, bounding box dimensions are calculated by determining the dimensions of the assigned color in the image. A pair of the image and its labels forms one training sample, which can then be used for different machine learning tasks (image segmentation and object detection).

In some embodiments, abundant training samples are produced by altering parameters used to build the virtual 3D oil and gas field, which include but are not limited to object properties (materials, color, reflectivity, attenuation, and etc.), background scenes, light sources, relative geometry locations, physical external forces acting on the gas flows, and the data survey map. A deep learning model is trained using the training samples to detect instances of oil field facilities and associated emissions. There are many network models available, such as Fast R-CNN, Mask R-CNN, YOLO, etc. In examples, the machine learning model is a Mask R-CNN that produces object detection and segmentation simultaneously.

Figure 9:
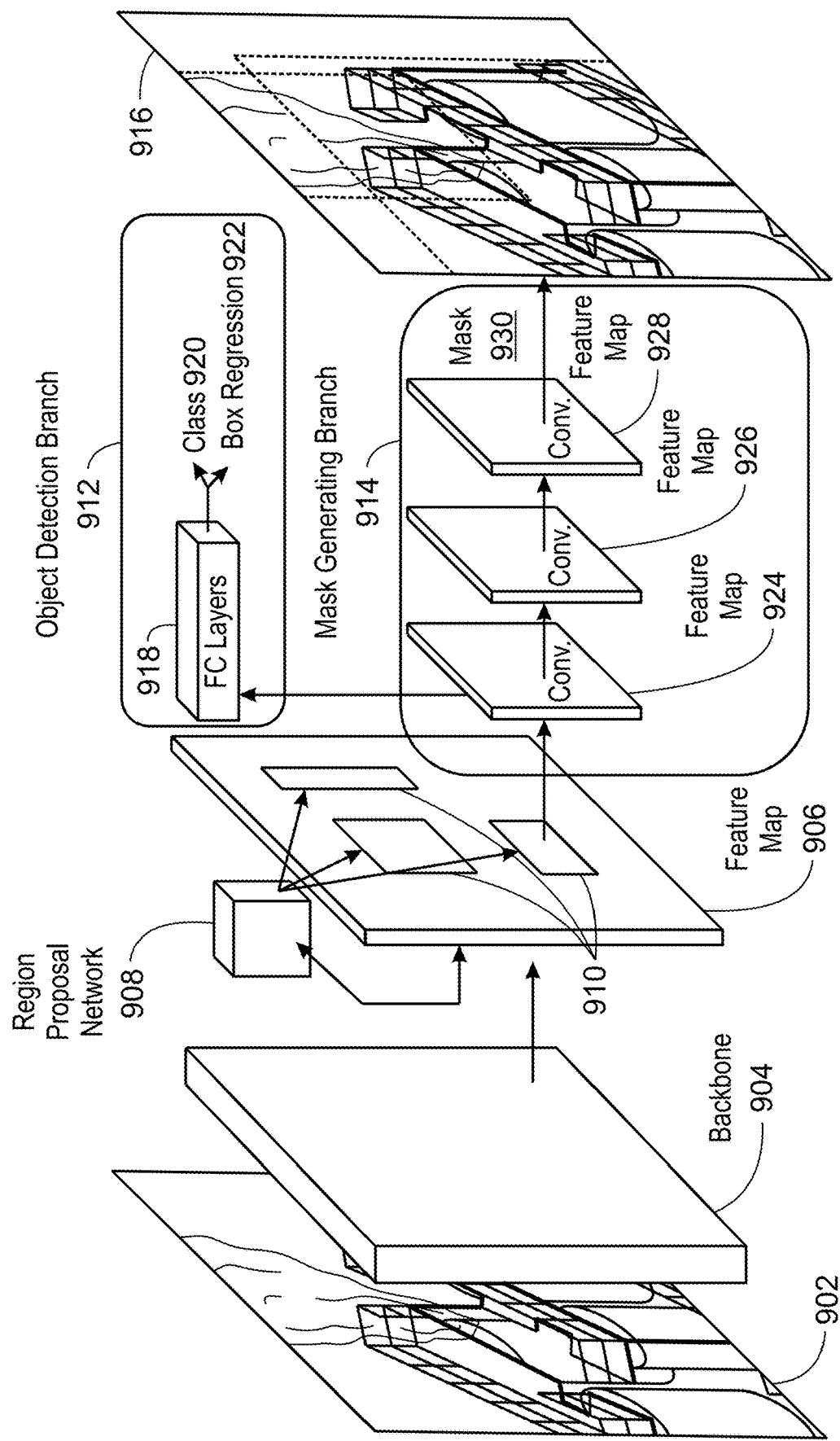
FIG. 9 shows a two-stage model.

FIG. 9 shows a two-stage model 900. In examples, the two-stage model 900 is a Mask R-CNN is a two-stage model where the first stage proposes Regions of Interest and the second stage predict classes (i.e., production facilities and emissions versus the background), bounding-boxes and masks for detected objects.

As shown in FIG. 9, an image 902 is input to the model. In examples, the input image is a 3D hyperspectral volume/tensor corresponding to an oil tank 3D model. The image 902 is input into the backbone network 904 which is the main feature extractor of Mask R-CNN. The feature map 906 is output from the final convolutional layer of the backbone 904. The feature map 906 contains abstract information of the input image, e.g., different object instances, their classes and spatial properties. The feature map 906 is input into a Region Proposal Network (RPN) 908. RPN 908 scans the feature map 906 and proposes regions 910 that may have objects in them. After that, the model bifurcates into an object detection branch 912 and a mask generation branch 914. The object detection branch 912 takes the regions of interest (ROI) feature map (906, 910) and predicts the object category, in this case oil field facilities, GHG emissions, or background, and a more accurate instance bounding box as illustrated by the predictions 916. Fully connected layers 918 output a class 920 and box regression 922. The mask generation branch 914 consists of successive convolutional network layers 924, 926, and 928, producing output mask 930 according to the class prediction in object detection branch corresponding to the predictions 916. Once the deep learning model is trained with sufficient training samples, which are collected from the virtual 3D field environment, the deep learning model is tested using images and videos acquired from real work oil and gas fields.

Figure 10:
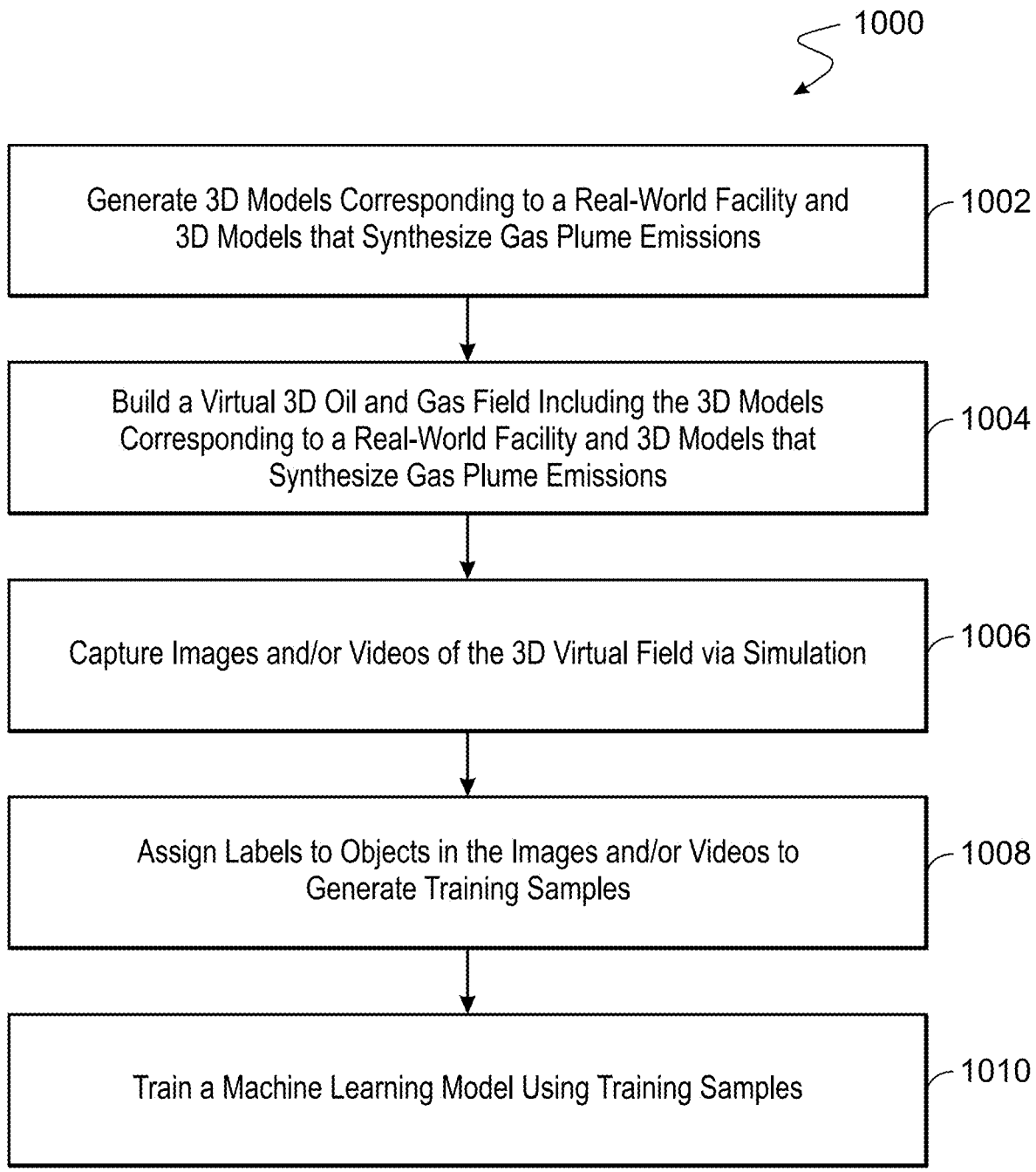
FIG. 10 is a process flow diagram of a process for generating training data using 3D modeling for machine learning-based greenhouse gas emission detection in oil and gas fields.

FIG. 10 is a process flow diagram of a process for generating training data using three dimensional (3D) modeling for machine learning-based greenhouse gas emission detection in oil and gas fields. In some embodiments, the machine learning models are trained as described with respect to FIG. 9. The present techniques introduce a systematic and automated procedure produce training data to train models that predict greenhouse gas emissions.

At block 1002, at least one 3D model corresponding to a real-world facility is generated, and at least one 3D model that synthesizes gas plume emissions is generated. For example, 3D models corresponding to real world oil and gas facilities are generated. GHG emissions are represented by gas plume 3D models.

At block 1004, a virtual environment including a hydrocarbon field is built. In examples, the field is a 3D oil and gas field. The field is based on the at least one 3D model corresponding to the real-world facility and at least one 3D model that synthesizes gas plume emissions. Accordingly, a 3D field in the virtual environment is represented by one or more 3D models. At block 1006, images and/or videos of the 3D field are captured. In examples, the images and/or videos of the 3D virtual field are captured during simulation of the 3D virtual field. In examples, simulation refers to enacting production at the 3D field over a period of time, wherein production at various components of the 3D field are associated with GHG emissions. In some embodiments, the simulation is recorded or captured by simulating drone-based image capture or drone based video capture. In examples, image capture is at a predetermined angle of image capture. In examples, video capture is a video recording along a predetermined path.

At block 1008, labels are assigned to objects in the images and/or videos. The image/video and corresponding labels form a training sample. Training samples include the image or video with synthetic data and the corresponding labels. The labels identify object types in the images or video. In examples, the object types are associated with GHG emissions represented by gas plume 3D models. At block 1010, a machine learning model is trained. In examples, a trained machine learning model is used to predict, classify, or detect GHG emissions. Images or video of real world facilities are input to the trained machine learning model to predict real-world GHG emissions, in real time. In this manner, the present techniques enable detection of greenhouse cases at a lower cost when compared to traditional techniques.

Figure 11:
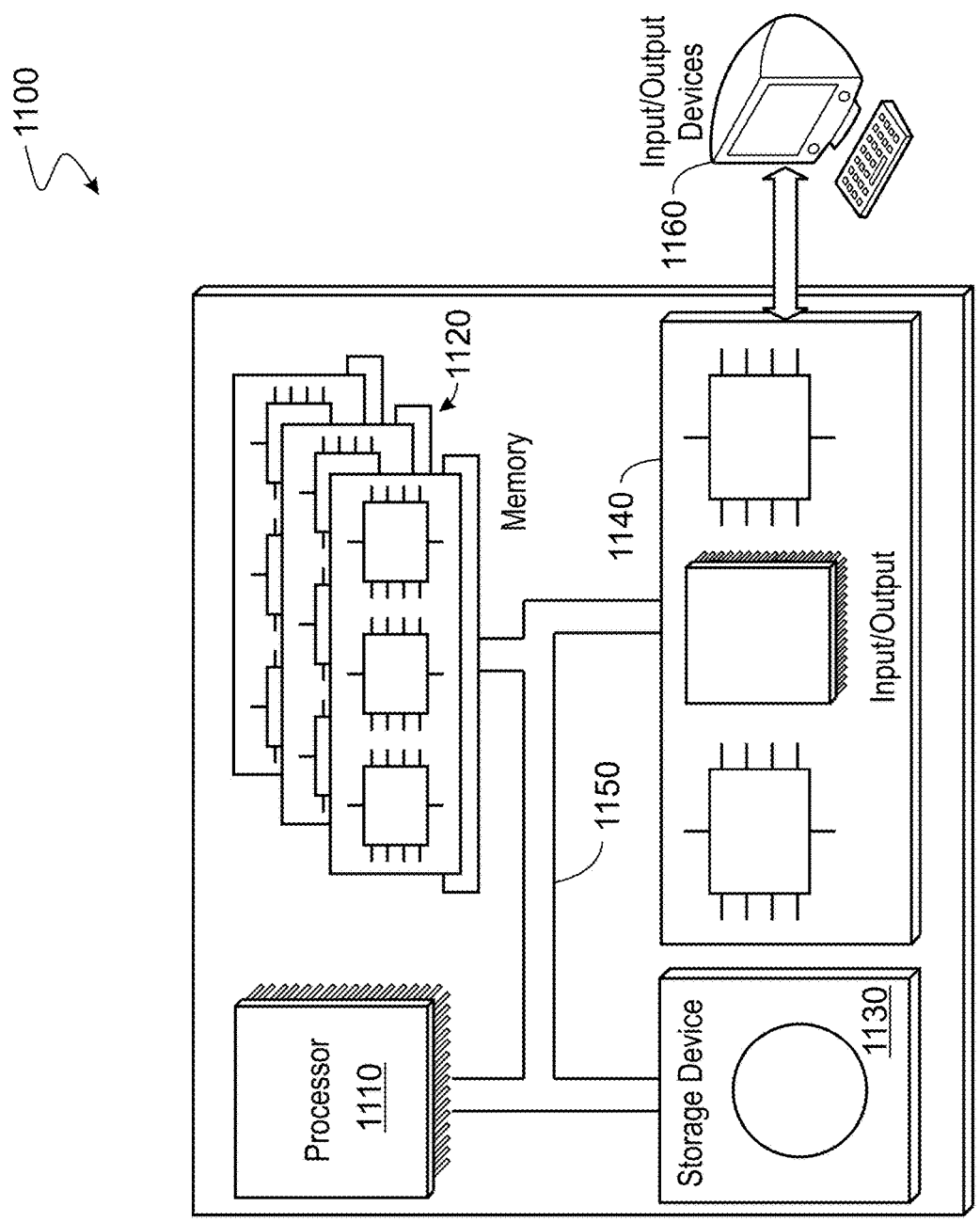
FIG. 11 is a schematic illustration of an example controller for generating training samples via 3D modeling for machine learning-based greenhouse gas emission detection in oil and gas fields according to the present disclosure.

FIG. 11 is a schematic illustration of an example controller 1100 (or control system) for generating training samples via 3D modeling for machine learning-based greenhouse gas emission detection in oil and gas fields according to the present disclosure. For example, the controller 1100 may be operable according to the process 1000 of FIG. 10, using the workflow 100 of FIG. 1. The controller 1100 is intended to include various forms of digital computers, such as printed circuit boards (PCB), processors, digital circuitry, or otherwise parts of a system for supply chain alert management. Additionally the system can include portable storage media, such as, Universal Serial Bus (USB) flash drives. For example, the USB flash drives may store operating systems and other applications. The USB flash drives can include input/output components, such as a wireless transmitter or USB connector that may be inserted into a USB port of another computing device.

The controller 1100 includes a processor 1110, a memory 1120, a storage device 1130, and an input/output interface 1140 communicatively coupled with input/output devices 1160 (for example, displays, keyboards, measurement devices, sensors, valves, pumps). Each of the components 1110, 1120, 1130, and 1140 are interconnected using a system bus 1150. The processor 1110 is capable of processing instructions for execution within the controller 1100. The processor may be designed using any of a number of architectures. For example, the processor 1110 may be a CISC (Complex Instruction Set Computers) processor, a RISC (Reduced Instruction Set Computer) processor, or a MISC (Minimal Instruction Set Computer) processor.

In one implementation, the processor 1110 is a single-threaded processor. In another implementation, the processor 1110 is a multi-threaded processor. The processor 1110 is capable of processing instructions stored in the memory 1120 or on the storage device 1130 to display graphical information for a user interface on the input/output interface 1140.

The memory 1120 stores information within the controller 1100. In one implementation, the memory 1120 is a computer-readable medium. In one implementation, the memory 1120 is a volatile memory unit. In another implementation, the memory 1120 is a nonvolatile memory unit.

The storage device 1130 is capable of providing mass storage for the controller 1100. In one implementation, the storage device 1130 is a computer-readable medium. In various different implementations, the storage device 1130 may be a floppy disk device, a hard disk device, an optical disk device, or a tape device.

The input/output interface 1140 provides input/output operations for the controller 1100. In one implementation, the input/output devices 1160 includes a keyboard and/or pointing device. In another implementation, the input/output devices 1160 includes a display unit for displaying graphical user interfaces.

There can be any number of controllers 1100 associated with, or external to, a computer system containing controller 1100, with each controller 1100 communicating over a network. Further, the terms "client," "user," and other appropriate terminology can be used interchangeably, as appropriate, without departing from the scope of the present disclosure. Moreover, the present disclosure contemplates that many users can use one controller 1100 and one user can use multiple controllers 1100.

Implementations of the subject matter and the functional operations described in this specification can be implemented in digital electronic circuitry, in tangibly embodied computer software or firmware, in computer hardware, including the structures disclosed in this specification and their structural equivalents, or in combinations of one or more of them. Software implementations of the described subject matter can be implemented as one or more computer programs. Each computer program can include one or more modules of computer program instructions encoded on a tangible, non-transitory, computer-readable computer-storage medium for execution by, or to control the operation of, data processing apparatus. Alternatively, or additionally, the program instructions can be encoded in/on an artificially generated propagated signal. The example, the signal can be a machine-generated electrical, optical, or electromagnetic signal that is generated to encode information for transmission to suitable receiver apparatus for execution by a data processing apparatus. The computer-storage medium can be a machine-readable storage device, a machine-readable storage substrate, a random or serial access memory device, or a combination of computer-storage mediums.

The terms "data processing apparatus," "computer," and "electronic computer device" (or equivalent as understood by one of ordinary skill in the art) refer to data processing hardware. For example, a data processing apparatus can encompass all kinds of apparatus, devices, and machines for processing data, including by way of example, a programmable processor, a computer, or multiple processors or computers. The apparatus can also include special purpose logic circuitry including, for example, a central processing unit (CPU), a field programmable gate array (FPGA), or an application specific integrated circuit (ASIC). In some implementations, the data processing apparatus or special purpose logic circuitry (or a combination of the data processing apparatus or special purpose logic circuitry) can be hardware- or software-based (or a combination of both hardware- and software-based). The apparatus can optionally include code that creates an execution environment for computer programs, for example, code that constitutes processor firmware, a protocol stack, a database management system, an operating system, or a combination of execution environments. The present disclosure contemplates the use of data processing apparatuses with or without conventional operating systems, for example, LINUX, UNIX, WINDOWS, MAC OS, ANDROID, or IOS.

A computer program, which can also be referred to or described as a program, software, a software application, a module, a software module, a script, or code, can be written in any form of programming language. Programming languages can include, for example, compiled languages, interpreted languages, declarative languages, or procedural languages. Programs can be deployed in any form, including as stand-alone programs, modules, components, subroutines, or units for use in a computing environment. A computer program can, but need not, correspond to a file in a file system. A program can be stored in a portion of a file that holds other programs or data, for example, one or more scripts stored in a markup language document, in a single file dedicated to the program in question, or in multiple coordinated files storing one or more modules, sub programs, or portions of code. A computer program can be deployed for execution on one computer or on multiple computers that are located, for example, at one site or distributed across multiple sites that are interconnected by a communication network. While portions of the programs illustrated in the various figures may be shown as individual modules that implement the various features and functionality through various objects, methods, or processes, the programs can instead include a number of sub-modules, third-party services, components, and libraries. Conversely, the features and functionality of various components can be combined into single components as appropriate. Thresholds used to make computational determinations can be statically, dynamically, or both statically and dynamically determined.

The methods, processes, or logic flows described in this specification can be performed by one or more programmable computers executing one or more computer programs to perform functions by operating on input data and generating output. The methods, processes, or logic flows can also be performed by, and apparatus can also be implemented as, special purpose logic circuitry, for example, a CPU, an FPGA, or an ASIC.

Computers suitable for the execution of a computer program can be based on one or more of general and special purpose microprocessors and other kinds of CPUs. The elements of a computer are a CPU for performing or executing instructions and one or more memory devices for storing instructions and data. Generally, a CPU can receive instructions and data from (and write data to) a memory. A computer can also include, or be operatively coupled to, one or more mass storage devices for storing data. In some implementations, a computer can receive data from, and transfer data to, the mass storage devices including, for example, magnetic, magneto optical disks, or optical disks. Moreover, a computer can be embedded in another device, for example, a mobile telephone, a personal digital assistant (PDA), a mobile audio or video player, a game console, a global positioning system (GPS) receiver, or a portable storage device such as a universal serial bus (USB) flash drive.

Computer readable media (transitory or non-transitory, as appropriate) suitable for storing computer program instructions and data can include all forms of permanent/non-permanent and volatile/non-volatile memory, media, and memory devices. Computer readable media can include, for example, semiconductor memory devices such as random access memory (RAM), read only memory (ROM), phase change memory (PRAM), static random access memory (SRAM), dynamic random access memory (DRAM), erasable programmable read-only memory (EPROM), electrically erasable programmable read-only memory (EEPROM), and flash memory devices. Computer readable media can also include, for example, magnetic devices such as tape, cartridges, cassettes, and internal/removable disks. Computer readable media can also include magneto optical disks and optical memory devices and technologies including, for example, digital video disc (DVD), CD ROM, DVD+/−R, DVD-RAM, DVD-ROM, HD-DVD, and BLU-RAY. The memory can store various objects or data, including caches, classes, frameworks, applications, modules, backup data, jobs, web pages, web page templates, data structures, database tables, repositories, and dynamic information. Types of objects and data stored in memory can include parameters, variables, algorithms, instructions, rules, constraints, and references. Additionally, the memory can include logs, policies, security or access data, and reporting files. The processor and the memory can be supplemented by, or incorporated in, special purpose logic circuitry.

Implementations of the subject matter described in the present disclosure can be implemented on a computer having a display device for providing interaction with a user, including displaying information to (and receiving input from) the user. Types of display devices can include, for example, a cathode ray tube (CRT), a liquid crystal display (LCD), a light-emitting diode (LED), and a plasma monitor. Display devices can include a keyboard and pointing devices including, for example, a mouse, a trackball, or a trackpad. User input can also be provided to the computer through the use of a touchscreen, such as a tablet computer surface with pressure sensitivity or a multi-touch screen using capacitive or electric sensing. Other kinds of devices can be used to provide for interaction with a user, including to receive user feedback including, for example, sensory feedback including visual feedback, auditory feedback, or tactile feedback. Input from the user can be received in the form of acoustic, speech, or tactile input. In addition, a computer can interact with a user by sending documents to, and receiving documents from, a device that is used by the user. For example, the computer can send web pages to a web browser on a user's client device in response to requests received from the web browser.

The term "graphical user interface," or "GUI," can be used in the singular or the plural to describe one or more graphical user interfaces and each of the displays of a particular graphical user interface. Therefore, a GUI can represent any graphical user interface, including, but not limited to, a web browser, a touch screen, or a command line interface (CLI) that processes information and efficiently presents the information results to the user. In general, a GUI can include a plurality of user interface (UI) elements, some or all associated with a web browser, such as interactive fields, pull-down lists, and buttons. These and other UI elements can be related to or represent the functions of the web browser.

Implementations of the subject matter described in this specification can be implemented in a computing system that includes a back end component, for example, as a data server, or that includes a middleware component, for example, an application server. Moreover, the computing system can include a front-end component, for example, a client computer having one or both of a graphical user interface or a Web browser through which a user can interact with the computer. The components of the system can be interconnected by any form or medium of wireline or wireless digital data communication (or a combination of data communication) in a communication network. Examples of communication networks include a local area network (LAN), a radio access network (RAN), a metropolitan area network (MAN), a wide area network (WAN), Worldwide Interoperability for Microwave Access (WIMAX), a wireless local area network (WLAN) (for example, using 802.11 a/b/g/n or 802.20 or a combination of protocols), all or a portion of the Internet, or any other communication system or systems at one or more locations (or a combination of communication networks). The network can communicate with, for example, Internet Protocol (IP) packets, frame relay frames, asynchronous transfer mode (ATM) cells, voice, video, data, or a combination of communication types between network addresses.

The computing system can include clients and servers. A client and server can generally be remote from each other and can typically interact through a communication network. The relationship of client and server can arise by virtue of computer programs running on the respective computers and having a client-server relationship. Cluster file systems can be any file system type accessible from multiple servers for read and update. Locking or consistency tracking may not be necessary since the locking of exchange file system can be done at application layer. Furthermore, Unicode data files can be different from non-Unicode data files.

While this specification contains many specific implementation details, these should not be construed as limitations on the scope of what may be claimed, but rather as descriptions of features that may be specific to particular implementations. Certain features that are described in this specification in the context of separate implementations can also be implemented, in combination, in a single implementation. Conversely, various features that are described in the context of a single implementation can also be implemented in multiple implementations, separately, or in any suitable sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results. In certain circumstances, multitasking or parallel processing (or a combination of multitasking and parallel processing) may be advantageous and performed as deemed appropriate.

Moreover, the separation or integration of various system modules and components in the previously described implementations should not be understood as requiring such separation or integration in all implementations, and it should be understood that the described program components and systems can generally be integrated together in a single software product or packaged into multiple software products.

Accordingly, the previously described example implementations do not define or constrain the present disclosure. Other changes, substitutions, and alterations are also possible without departing from the spirit and scope of the present disclosure.

Furthermore, any claimed implementation is considered to be applicable to at least a computer-implemented method: a non-transitory, computer-readable medium storing computer-readable instructions to perform the computer-implemented method; and a computer system comprising a computer memory interoperably coupled with a hardware processor configured to perform the computer-implemented method or the instructions stored on the non-transitory, computer-readable medium.

Particular embodiments of the subject matter have been described. Other embodiments are within the scope of the following claims. For example, the actions recited in the claims can be performed in a different order and still achieve desirable results. As one example, some processes depicted in the accompanying figures do not necessarily require the particular order shown, or sequential order, to achieve desirable results.

What is claimed is:

1. A computer-implemented method for generating training data using three dimensional (3D) modeling for machine learning-based greenhouse gas emission detection in oil and gas fields, the method comprising:

generating, using at least one hardware processor, at least one 3D model corresponding to a real-world facility and at least one 3D model corresponding to gas emission plumes;

building, using at least one hardware processor, a virtual environment comprising a 3D field based on the at least one 3D model corresponding to the real-world facility and the at least one 3D model corresponding to gas emission plumes;

capturing, using the at least one hardware processor, images or video of the 3D field via simulation of the virtual environment;

assigning, using the at least one hardware processor, labels to objects in the images or videos to generate labeled images or videos; and training, using the at least one hardware processor, machine learning models using training samples including the labeled images or videos.

2. The computer implemented method of claim 1, wherein simulation of the virtual environment comprises simulation of the 3D field via drone based image capture at a predetermined angle of image capture.

3. The computer implemented method of claim 1, wherein simulation of the virtual environment comprises simulation of the 3D field via drone based video capture along as the drone traverses a predetermined path.

4. The computer implemented method of claim 1, wherein the images or video of the 3D field comprise varying spectral bands.

5. The computer implemented method of claim 1, wherein the machine learning models are trained to detect spectral variations among objects and greenhouse gases in the captured images or video to predict greenhouse gas emissions.

6. The computer implemented method of claim 1, wherein the at least one a real-world facility corresponds to a physical oil and gas field.

7. The computer implemented method of claim 1, wherein the gas emission plumes correspond to average emission values from respective oil and gas facilities.

8. An apparatus comprising a non-transitory, computer readable, storage medium that stores instructions that, when executed by at least one processor, cause the at least one processor to perform operations comprising:
generating at least one 3D model corresponding to a real-world facility and at least one 3D model corresponding to gas emission plumes;
building a virtual environment comprising a 3D field based on the at least one 3D model corresponding to the real-world facility and the at least one 3D model corresponding to gas emission plumes;
capturing images or video of the 3D field via simulation of the virtual environment;
assigning labels to objects in the images or videos to generate labeled images or videos; and
training machine learning models using training samples including the labeled images or videos.

9. The apparatus of claim 8, wherein simulation of the virtual environment comprises simulation of the 3D field via drone based image capture at a predetermined angle of image capture.

10. The apparatus of claim 8, wherein simulation of the virtual environment comprises simulation of the 3D field via drone based video capture along as the drone traverses a predetermined path.

11. The apparatus of claim 8, wherein the images or video of the 3D field comprise varying spectral bands.

12. The apparatus of claim 8, wherein the machine learning models are trained to detect spectral variations among objects and greenhouse gases in the captured images or video to predict greenhouse gas emissions.

13. The apparatus of claim 8, wherein the at least one a real-world facility corresponds to a physical oil and gas field.

14. The apparatus of claim 8, wherein the gas emission plumes correspond to average emission values from respective oil and gas facilities.

15. A system, comprising:
one or more memory modules;
one or more hardware processors communicably coupled to the one or more memory modules, the one or more hardware processors configured to execute instructions stored on the one or more memory models to perform operations comprising:
generating at least one 3D model corresponding to a real-world facility and at least one 3D model corresponding to gas emission plumes;
building a virtual environment comprising a 3D field based on the at least one 3D model corresponding to the real-world facility and the at least one 3D model corresponding to gas emission plumes;
capturing images or video of the 3D field via simulation of the virtual environment;
assigning labels to objects in the images or videos to generate labeled images or videos; and
training machine learning models using training samples including the labeled images or videos.

16. The system of claim 15, wherein simulation of the virtual environment comprises simulation of the 3D field via drone based image capture at a predetermined angle of image capture.

17. The system of claim 15, wherein simulation of the virtual environment comprises simulation of the 3D field via drone based video capture along as the drone traverses a predetermined path.

18. The system of claim 15, wherein the images or video of the 3D field comprise varying spectral bands.

* * * * *